United States Patent
Fernandez

[19]

[11] Patent Number: 6,139,676
[45] Date of Patent: Oct. 31, 2000

[54] APPARATUS AND METHOD FOR REMOVING SEMICONDUCTOR CHIPS FROM A DICED SEMICONDUCTOR WAFER

[75] Inventor: Joseph D. Fernandez, Gilbert, Ariz.

[73] Assignee: Microchip Technology Incorporated, Chandler, Ariz.

[21] Appl. No.: 08/911,603

[22] Filed: Aug. 14, 1997

[51] Int. Cl.[7] ..................................................... B32B 35/00
[52] U.S. Cl. ........................ 156/344; 156/584; 438/464; 438/976
[58] Field of Search .................................... 156/344, 584; 438/33, 68, 113, 114, 464, 465, 976, FOR 386; 29/426.1, 426.3, 426.5, 426.6, 762

[56] References Cited

U.S. PATENT DOCUMENTS

| | | | |
|---|---|---|---|
| 4,859,269 | 8/1989 | Nishiguchi | 156/344 X |
| 4,865,677 | 9/1989 | Matsushita et al. | 156/522 X |
| 5,725,728 | 3/1998 | Fuke et al. | 156/344 |

FOREIGN PATENT DOCUMENTS 62-133731  6/1987  Japan ..................................... 156/584

*Primary Examiner*—Mark A. Osele
*Attorney, Agent, or Firm*—Paul N. Katz; Ronald L. Chichester; Frohwitter

[57] ABSTRACT

An apparatus and method is disclosed for removing a selected semiconductor chip from a semiconductor wafer. The selected semiconductor chip is elevated by the use of an X—Y—Z assembly by having a rounded tip portion of a round probe member assembly that is part of the X—Y—Z assembly contact a back portion of a flexible, transparent backing layer beneath the selected semiconductor chip so that removal of the semiconductor chip can be completed by using a vacuum type pencil.

16 Claims, 3 Drawing Sheets

APPARATUS AND METHOD FOR REMOVING SEMICONDUCTOR CHIPS FROM A DICED SEMICONDUCTOR WAFER

FIELD OF THE INVENTION

This invention relates generally to apparatus and methods for removing semiconductor chips from diced semiconductor wafers and, more particularly, to an apparatus and method for selectively removing semiconductor chips of varying sizes from a diced semiconductor wafer.

BACKGROUND OF THE PRIOR ART

In the past, semiconductor wafers were processed through various processing stages or steps depending usually upon which semiconductor devices were being fabricated in the semiconductor chips that all together comprised the semiconductor wafers. For example, bipolar semiconductor devices usually had a series of processing steps that were different, at least in some respects, to the processing steps used to fabricate MOS or unipolar semiconductor devices. Consequently, semiconductor chips that were fabricated in a single wafer that contained bipolar semiconductor devices could have dimensions different than semiconductor chips, for example, that contained MOS or CMOS devices. Furthermore, a single wafer fabricated to contain a large number of semiconductor chips having either or both Bipolar and/or Unipolar (MOS or CMOS) semiconductor devices could have different semiconductor chip size dimensions.

Therefore, after a dicing operation (i.e. such as by using a diamond blade assembly making both X and Y type cutting passes) wherein a semiconductor wafer is diced up into a plurality of semiconductor chips (with either all having the same size dimensions such as, for example, for the production of semiconductor memory chips or differing size dimensions for at least some of the semiconductor chips, it was usually necessary to pick up one or more of these diced semiconductor chips for visual and/or electrical examination purposes and/or for packaging the selected picked-up semiconductor chips in, for example, lead frame type packages.

A major problem with past techniques that were used to pick-up semiconductor chips from a diced semiconductor wafer was the inadvertent destruction of the chip or chips that were being picked up. Initially, semiconductor chips were being handled by, for example, tweezer type devices that would often destroy the semiconductor chip or the semiconductor devices located thereon or one or more electrically conductive lands or pads located on the semiconductor chip surface.

Hence, the semiconductor chip processing or handling technology evolved to a point in thinking about this yield problem where it is deemed to be better, for yield purposes, to remove semiconductor chips from a semiconductor wafer without the use of tweezers or similar type devices operating on or contacting the surface of the semiconductor chips containing the active and/or passive semiconductor devices and/or the metalization pattern for electrical connection to the various (active or passive) semiconductor devices.

In attempting to somehow contact the backside portion of a diced semiconductor chip for the removal thereof from a semiconductor wafer, this backside approach was difficult to do because of a number or problems. One problem was in the difficulty of accurately seeing the precise location of the backside portion of the semiconductor chip to be selected from the usually large number of semiconductor chips that comprise the semiconductor wafer. Another problem was to avoid creating openings in a backing material upon which the diced semiconductor wafer was located because these (undesired) openings in the backing material will prevent passing the combined diced wafer and backing material to pass through other dicing saw machine operations where a vacuum is needed to hold the wafer down, but cannot be achieved if there are holes in the backing material.

Accordingly, a need existed for an apparatus and method for removing semiconductor chips from a diced semiconductor wafer without damaging the active surface of each of the semiconductor chips that are being removed and without creating openings in a backing material located behind the semiconductor wafer.

SUMMARY OF THE INVENTION

Therefore, it is an object of this invention to provide an improved apparatus and method for removing semiconductor chips from a diced semiconductor wafer.

It is a further object of this invention to provide an improved apparatus and method for removing by elevating each selected semiconductor chip for the removal thereof by contact at the backside portion of each semiconductor chip.

It is a still further object of this invention to provide an improved apparatus and method for removing semiconductor chips from a diced semiconductor wafer by elevating each selected semiconductor chip for the removal thereof by contact at the backside portion of each semiconductor chip without creating any opening(s) in a backing layer or material in contact with the backside portion of the diced semiconductor wafer.

It is still another object of this invention to provide an improved apparatus and method for removing semiconductor chips of varying sizes from a single diced semiconductor wafer.

It is an object of this invention to provide an improved apparatus and method for removing semiconductor chips of varying sizes from a single diced semiconductor wafer by contact at the backside portion of each semiconductor chip of each varied size without creating any opening(s) in a backing layer or material in contact with the backside portion of the diced semiconductor wafer.

It is another object of this invention to provide an improved apparatus and method for removing diced semiconductor chips and still permitting a diced wafer and backing material to achieve multiple passes through a dicing saw operation without losing vacuum.

BRIEF DESCRIPTION OF THE PREFERRED EMBODIMENTS

In accordance with one embodiment of this invention, an apparatus is provided for removing semiconductor chips from a semiconductor wafer which comprises, in combination: a diced semiconductor wafer having a plurality of diced semiconductor chips; a transparent flexible sheet located below and in contact with the diced semiconductor wafer; and X—Y—Z means located below the transparent flexible sheet and having a round probe member assembly for selectively elevating one of the plurality of semiconductor chips by pressing against a rear portion of the transparent flexible sheet to bend the transparent flexible sheet to elevate the one of the plurality of diced semiconductor chips. This apparatus includes means located above the diced semiconductor wafer for removing the one of the plurality of diced semiconductor chips. Preferably, the removing means is a vacuum needle device. Preferably, the transparent flexible sheet has adhesive means located on a top surface thereof for reliably holding a back surface portion of each of the plurality of diced semiconductor chips. If desired, the plurality of diced semiconductor chips comprise semiconductor chips of varying dimensions.

In accordance with another embodiment of this invention, a method is disclosed for removing semiconductor chips from a semiconductor wafer which comprises forming a diced semiconductor wafer having a plurality of diced semiconductor chips; locating a transparent flexible sheet below and in contact with the diced semiconductor wafer; and providing X—Y—Z means located below the transparent flexible sheet and having a round probe member assembly for selectively elevating one of the plurality of semiconductor chips by pressing against a rear portion of the transparent flexible sheet to bend the transparent flexible sheet to elevate the one of the plurality of diced semiconductor chips. The method further includes providing means located above the diced semiconductor wafer for removing the one of the plurality of diced semiconductor chips. Preferably, the removing means is a vacuum needle device. Preferably, the transparent flexible sheet has adhesive means located on a top surface thereof for reliably holding a back surface portion of each of the plurality of diced semiconductor chips. If desired, the plurality of diced semiconductor chips comprise semiconductor chips of varying dimensions.

The foregoing and other objects, features and advantages of this invention will be apparent from the following more particular description of the preferred embodiments of the invention as illustrated in the accompanying drawings.

DESCRIPTION OF THE SPECIFICATION

Figure 1:
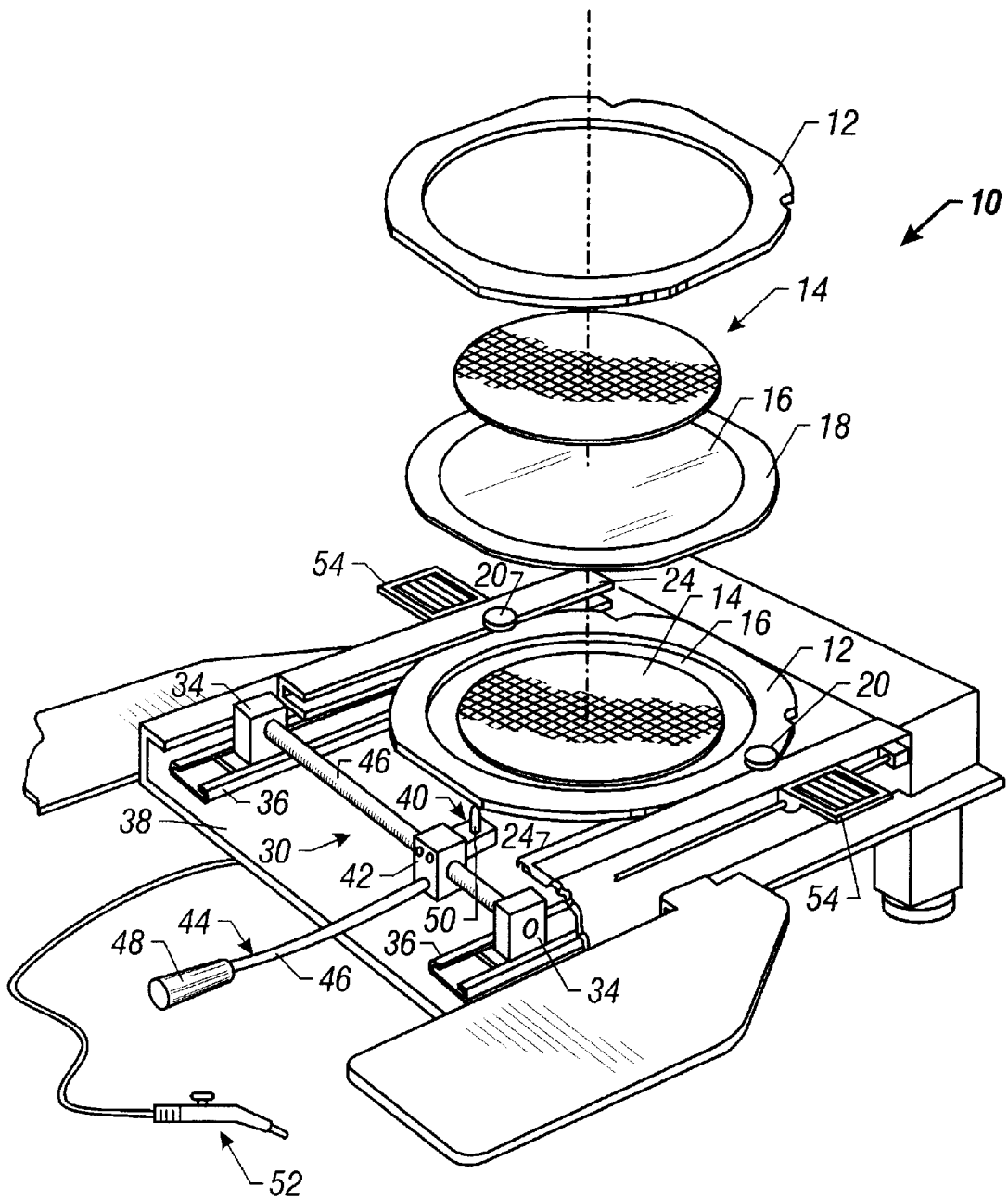
FIG. 1 is a perspective exploded view illustrating the apparatus of this invention for removing semiconductor chips from a diced semiconductor wafer.

Referring to FIG. 1, an apparatus for removing semiconductor chips from a diced semiconductor wafer is generally designated by reference number 10. FIG. 1 depicts the apparatus 10 in an exploded form with parts shown spaced apart for ease in the explanation of the apparatus 10. Consequently, three elements of the apparatus 10 are depicted as spaced apart above the apparatus 10 (the upper portion of FIG. 1), but when used on the apparatus 10, these three elements are located as shown in the lower portion of FIG. 1 that illustrates the three elements in assembled form as part of the apparatus 10. Thus the reference number used to designate the three elements in the upper portion of FIG. 1 are used again to designate these same three elements when assembled together as shown in the lower portion of FIG. 1. Accordingly, reference number 12 designates an apertured top (preferably metal) clamping member that is used to surround a diced semiconductor wafer generally represented by reference number 14 and to hold in place a backing layer 16 that is attached to a bottom (preferably metal) apertured support member 18. The backing layer 16 is transparent and flexible and has an adhesive top surface layer which functions both to hold the diced semiconductor chips of the diced semiconductor wafer 14 in place thereon as well as to attach to a bottom annular perimeter portion of the bottom apertured support member 18.

When assembled together as shown in the bottom portion of FIG. 1, a pair of clamping devices 20 are used to hold down (and thereby hold in place) the apertured top clamping member 12 which functions to hold down the bottom apertured support member 18 onto side rail portions 24 located on side portions of the apparatus 10. The clamping devices 20 are removable or connectable by rotation thereof in counterclockwise and clockwise directions, respectively, to lock in place the top apertured member 12 by contact engagement between the bottom portions of the clamping devices 20 with top surface perimeter portions of the top apertured member 12. Threaded openings in the side rail portions (not shown) can be used to hold bottom threaded shaft portions (not shown) attached to the round enlarged heads of the clamping devices 20. Alternatively, the clamping devices 20 can be pivoted into clamping position by attached pivoting members (not shown) that would be pivotally connectable to the side rail portions 24.

The clamping devices 20 clamp down the top apertured member 12 against the bottom apertured support member 18 which is supported on the side rail portions 24. This permits the fixed positioning of the diced semiconductor wafer 14 on the adhesive surface coated, transparent and flexible backing layer 16.

In order to remove a selected diced semiconductor chip from the diced semiconductor wafer 14, an X—Y—Z assembly or means generally designated by reference number 30 is used. The X—Y—Z assembly 30 comprises a bar member 32 that is preferably rotatably connected at the two ends thereof to two support members 34 which are both reciprocally moveable in one dimension (X or Y depending on a selected designation) because of being slidable within two side tracks 36 that are attached to a base plate or support 38 of the apparatus 10.

A round probe member assembly 40 is used to operate against the back portion of the adhesive surface coated, transparent and flexible backing layer 16 as is described in further detail in connection with the description of FIGS. 2–4. The round probe member assembly 40 is preferably connected to a slidable coupling member 42 that is both rotatably and slidably mounted or connected to the bar member 32. Handle member means 44 which comprises an elongated rod shaped portion 46 and a handle holding portion 48 connected thereto is also connected to the coupling member 42 preferably to a side portion thereof opposite to the side portion to which the round probe member assembly 40 is connected. The handle member means 44 permits a user of the apparatus 10 to grip the handle holding portion 48 and thereby exert a force in one direction (X or Y depending on a selected designation) to move the round probe member assembly 40 beneath a selected portion of the backing layer 16 due to movement of the bar member 32 and associated support members 34 which are moveable on the tracks 36. Movement of the round probe member assembly 40 in the other direction (Y or X depending on a selected designation) is achieved because the handle member means 44 can move or slide the coupling member 42 back and forth on the bar member 32. This completes focusing the round probe member assembly 40 (after both X and Y directions are satisfied) beneath a selected diced semiconductor chip of the diced semiconductor wafer 14. At this time, the user lowers the handle holding portion 48 thereby rotating the attached rotatable and slidable coupling member 42 about the bar 32 or, in effect, pivoting the round probe member assembly 40 with its rounded tip portion 50 into contact with a portion of the back of the backing layer 16 directly beneath the selected semiconductor chip to be removed from the diced semiconductor wafer 14. Thus, the flexible nature of the backing layer 16 permits the rounded tip portion 50 of the round probe member assembly 40 to act against the back portion of the backing layer 16 (and not directly contact the selected semiconductor chip) because the flexible nature of the flexible backing layer 16 is used to elevate the selected semiconductor chip to permit the elevated selected semiconductor chip to be picked off the adhesive coated backing layer 16 by a vacuum pencil type device 52 as shown in FIG. 4. One or more of the semiconductor chips plucked off by the vacuum pencil type device 52 can be placed, if desired, on one or the other of small side table members 54 as shown in FIG. 1.

Figure 2:
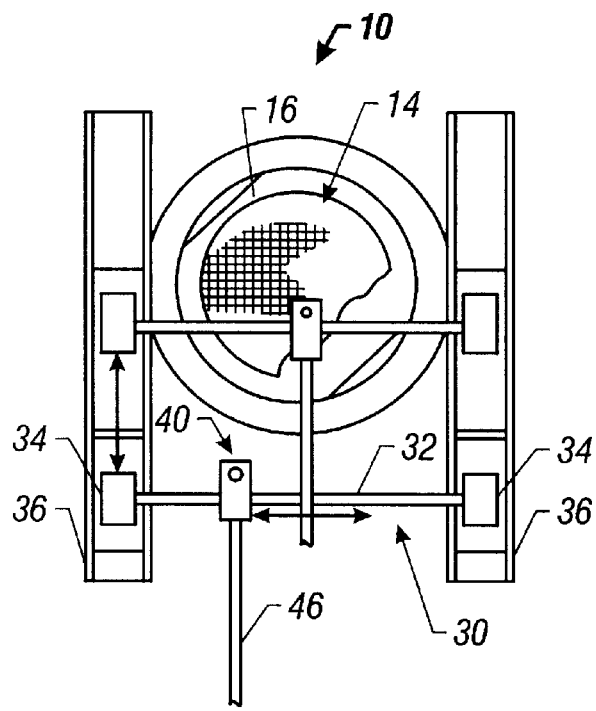
FIG. 2 is a top view (with parts broken away) of a portion of the apparatus of FIG. 1 showing the X and Y movement of a round probe member assembly beneath the back of a transparent flexible sheet that supports a diced semiconductor wafer on the other or top front side thereof.

FIG. 2, which is a top elevational view (with parts broken away) of the apparatus 10 of FIG. 1, depicts the motions of the X—Y—Z means 30 and shows in solid line form one position of the round probe member assembly 40 (not beneath the semiconductor wafer 14) and in dashed line form another position below a selected semiconductor chip at the rear thereof behind the backing layer 16.

Figure 3:
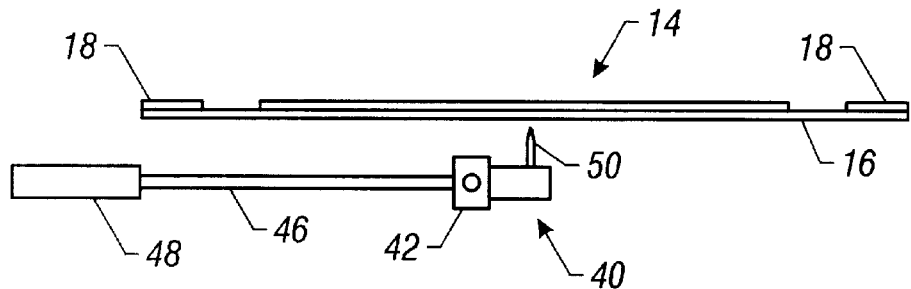
FIG. 3 is a side elevational view taken on line 3—3 of FIG. 2 showing the handle member means that is coupled to the round probe member assembly that are all located below the transparent flexible sheet.
Figure 4:
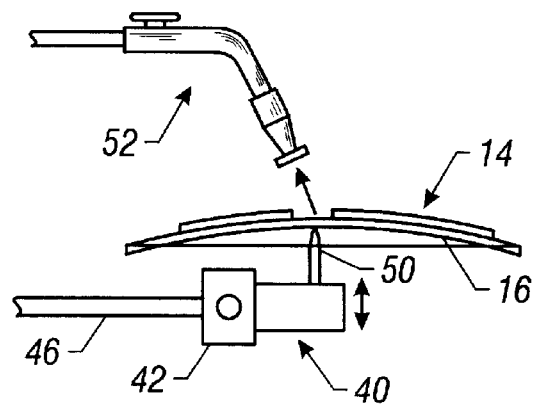
FIG. 4 is a side elevational view of how the round probe member assembly is actuated by the handle member means to press against a portion of the back of the transparent flexible sheet to elevate the selected semiconductor chip for removal by a vacuum pencil type device.

FIG. 3 is a side elevational view of the apparatus 10 of FIG. 2 taken on the line 3—3 of FIG. 2 prior to a user lowering a handle holding portion 48 to elevate the rounded tip portion 50 of the round probe member assembly 40 into contact with the back portion of the backing layer 16 below the selected semiconductor chip.

FIG. 4 is a side elevational view showing the rounded tip portion 50 of the round probe member assembly 40 in contact with a selected portion of the back of the backing layer 16 below the selected semiconductor chip. This Figure shows the flexing of the backing layer 16 to elevate the selected semiconductor chip in position to be easily plucked off the backing layer 16 by the vacuum needle type device 52.

Figure 5:
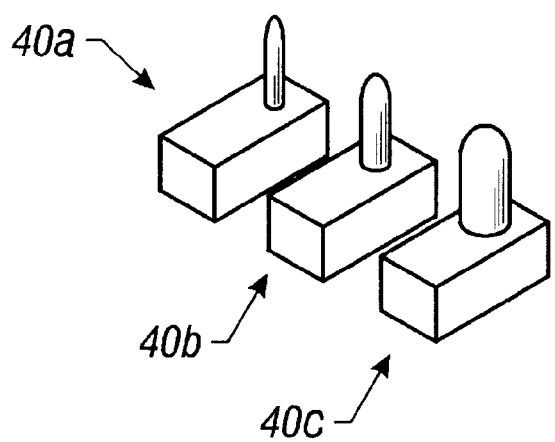
FIG. 5 is a perspective view of three different round probe assemblies having different sized rounded head portions for removing different sizes of diced semiconductor chips.

FIG. 5 depicts several (three) different round probe member assemblies 40A, 40B and 40C each having a different rounded tip portion 50A, 50B and 50C for use in elevating different sized semiconductor chips.

Figure 6:
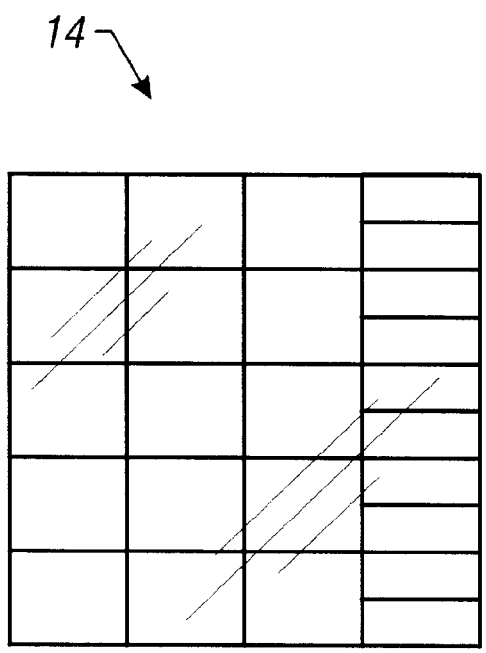
FIG. 6 is a graphical illustration of different sizes of diced semiconductor chips that comprise a portion of diced semiconductor wafer.

FIG. 6 is an illustrative enlarged view of a portion of the semiconductor wafer 14 showing a plurality of semiconductor chips of different sizes. Thus, a selected round probe member assembly 40A or 40B or 40C can be used in the apparatus 10 to elevate a selected semiconductor chip having a size configuration closely matched to the selected semiconductor chip. The transparent backing layer 16 permits a user to precisely locate the selected semiconductor chip to be removed from the semiconductor wafer 14 both by viewing from below and above the transparent backing layer 16.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. An apparatus for removing semiconductor chips from a semiconductor wafer, comprising, in combination:

a diced semiconductor wafer having a plurality of diced semiconductor chips;

a transparent flexible sheet located below and in contact with said diced semiconductor wafer; and X—Y—Z means located below said transparent flexible sheet and having a round probe member assembly for selectively elevating one of said plurality of diced semiconductor chips by pressing against a rear portion of said transparent flexible sheet to bend said transparent flexible sheet to elevate said one of said plurality of diced semiconductor chips, wherein said X—Y—Z means comprising a bar member having said round probe member assembly coupled thereto for movement therewith, means for moving said bar member in one of an X direction and a Y direction, and means for moving said round probe member assembly in both the other of said X direction and said Y direction and in a Z direction to bend said transparent flexible sheet to elevate said one of said plurality of diced semiconductor chips, wherein said means for moving said round probe member assembly comprising handle member means coupled to said round probe member assembly for pivotally and selectively raising and lowering said round probe member assembly, and sliding means for permitting said round probe member assembly and said handle member means coupled thereto to be moved in the other of said X direction and said Y direction.

2. The apparatus of claim 1 including means located above said diced semiconductor wafer for removing said one of said plurality of diced semiconductor chips.

3. The apparatus of claim 2 wherein said removing means is a vacuum needle device.

4. The apparatus of claim 1 wherein said transparent flexible sheet having adhesive means located on a top surface thereof for reliably holding a back surface portion of each of said plurality of diced semiconductor chips.

5. The apparatus of claim 3 wherein said transparent flexible sheet having adhesive means located on a top surface thereof for reliably holding a back surface portion of each of said plurality of diced semiconductor chips.

6. The apparatus of claim 1 wherein said plurality of diced semiconductor chips comprising semiconductor chips of varying dimensions.

7. The apparatus of claim 6 wherein said round probe member assembly having a rounded head portion configured to bend said transparent flexible sheet to elevate said one of said plurality of semiconductor chips, and means for permitting substitution of other round probe members assemblies having different dimensioned rounded head portions to bend said transparent flexible sheet to selectively elevate other semiconductor chips of varying dimensions.

8. The apparatus of claim 1 wherein said means for moving said round probe member assembly further comprising a slidable and pivotal coupling member connected to both said handle member means and said round probe member assembly, said handle member means being located on one side of said coupling member, said round probe member assembly being located on the other side of said coupling member, said handle member means actuating movement of said round probe member assembly in all three (XYZ) directions.

9. A method for removing semiconductor chips from a semiconductor wafer comprising the steps of forming a diced semiconductor wafer having a plurality of diced semiconductor chips;

locating a transparent flexible sheet located below and in contact with said diced semiconductor wafer; and providing X—Y—Z means located below said transparent flexible sheet and having a round probe member assembly for selectively elevating one of said plurality of diced semiconductor chips by pressing against a rear portion of said transparent flexible sheet to bend said transparent flexible sheet to elevate said one of said plurality of diced semiconductor chips, wherein said X—Y—Z means comprising a bar member having said round probe member assembly coupled thereto for movement therewith, means for moving said bar member in one of an X direction and a Y direction, and means for moving said round probe member assembly in both the other of said X direction and said Y direction and in a Z direction to bend said transparent flexible sheet to elevate said one of said plurality of diced semiconductor chips, wherein said means for moving said round probe member assembly comprising handle member means coupled to said round probe member assembly for pivotally and selectively raising and lowering said round probe member assembly, and sliding means for permitting said round probe member assembly and said handle member means coupled thereto to be moved in the other of said X direction and said Y direction.

10. The method of claim 9 including providing means located above said diced semiconductor wafer for removing said one of said plurality of diced semiconductor chips.

11. The method of claim 10 wherein said removing means is a vacuum needle device.

12. The method of claim 11 wherein said transparent flexible sheet having adhesive means located on a top surface thereof for reliably holding a back surface portion of each of said plurality of diced semiconductor chips.

13. The method of claim 9 wherein said transparent flexible sheet having adhesive means located on a top surface thereof for reliably holding a back surface portion of each of said plurality of diced semiconductor chips.

14. The method of claim 9 wherein said plurality of diced semiconductor chips comprising semiconductor chips of varying dimensions.

15. The method of claim 14 wherein said round probe member assembly having a rounded head portion configured to bend said transparent flexible sheet to elevate said one of said plurality of semiconductor chips, and means for permitting substitution of other round probe members assemblies having different dimensioned rounded head portions to bend said transparent flexible sheet to selectively elevate other semiconductor chips of varying dimensions.

16. The method of claim 9 wherein said means for moving said round probe member assembly further comprising a slidable and pivotal coupling member connected to both said handle member means and said round probe member assembly, said handle member means being located on one side of said coupling member, said round probe member assembly being located on the other side of said coupling member, said handle member means actuating movement of said round probe member assembly in all three (XYZ) directions.

* * * * *